(12) United States Patent
Ishihara

(10) Patent No.: US 7,392,027 B2
(45) Date of Patent: Jun. 24, 2008

(54) AUTOMATIC GAIN CONTROL DEVICE, AUTOMATIC GAIN CONTROL METHOD, CONTROL PROGRAM FOR AUTOMATIC GAIN CONTROL DEVICE, RADIO COMMUNICATION TERMINAL HAVING AUTOMATIC CONTROL DEVICE, RADIO COMMUNICATION SYSTEM, AND RADIO COMMUNICATION METHOD

(75) Inventor: Takeshi Ishihara, Tokyo (JP)

(73) Assignee: NEC Corporation, Tokyo (JP)

( * ) Notice: Subject to any disclaimer, the term of this patent is extended or adjusted under 35 U.S.C. 154(b) by 488 days.

(21) Appl. No.: 11/087,574

(22) Filed: Mar. 24, 2005

(65) Prior Publication Data

US 2005/0221778 A1 Oct. 6, 2005

(30) Foreign Application Priority Data

Mar. 30, 2004 (JP) ............................. 2004-099582

(51) Int. Cl.
*H04B 7/00* (2006.01)
(52) U.S. Cl. ..................... 455/232.1; 455/436
(58) Field of Classification Search .............. 455/232.1, 455/234.1, 234.2, 250.1, 436, 437, 442
See application file for complete search history.

(56) References Cited

U.S. PATENT DOCUMENTS

| | | |
|---|---|---|
| 5,331,638 A | 7/1994 | Honkasalo et al. |
| 5,568,518 A | 10/1996 | Dent |
| 6,563,891 B1 | 5/2003 | Eriksson et al. |

(Continued)

FOREIGN PATENT DOCUMENTS

EP 1 184 975 A1 3/2002

(Continued)

OTHER PUBLICATIONS

3GPP TS 25.212 V4.6.0, http://www.3gpp.org/ftp/Specs/html-infor/25212.htm>: 3rd Generation Partnership Project; Technical Specification Group Radio Access Network; Multiplexing and channel coded (FDD) (Release 4), 2004, pp. 52-55.

(Continued)

*Primary Examiner*—Lee Nguyen
(74) *Attorney, Agent, or Firm*—Foley & Lardner LLP

(57) ABSTRACT

An automatic gain control device includes an amplifier for a reception signal, a signal processing unit, a memory, and a control unit. The amplifier can set a gain. The signal processing unit extracts control data from an output from the amplifier and performs information processing for the data. The memory stores the gain setting value of the amplifier. The control unit controls the gain of the amplifier in accordance with a preset control algorithm. On the basis of the result obtained when the control unit computes a gain setting value stored in the memory in accordance with a preset algorithm, the control unit controls the gain of the amplifier in correspondence with operation of switching the frequency of a reception signal, which is accompanied by different frequency monitoring in the compressed mode by the signal processing unit. A radio communication terminal, a control method for an automatic gain control device, a control program for an automatic gain control device, an automatic gain control method, a radio communication system, and a radio communication method are also disclosed.

14 Claims, 7 Drawing Sheets

U.S. PATENT DOCUMENTS

2002/0142778 A1 * 10/2002 Saito .................... 455/450

FOREIGN PATENT DOCUMENTS

| JP | 3064081 | 5/2000 |
|---|---|---|
| JP | 2000-236286 | 8/2000 |
| JP | 2002-076996 | 3/2002 |
| JP | 2003-124759 | 4/2003 |
| JP | 2003-209477 | 7/2003 |

OTHER PUBLICATIONS

K. Tachikawa, "W-CDMA Mobile Communication Systems," Jun. 2001, pp. 140-140, (4 pages of English translation.

* cited by examiner

AUTOMATIC GAIN CONTROL DEVICE, AUTOMATIC GAIN CONTROL METHOD, CONTROL PROGRAM FOR AUTOMATIC GAIN CONTROL DEVICE, RADIO COMMUNICATION TERMINAL HAVING AUTOMATIC CONTROL DEVICE, RADIO COMMUNICATION SYSTEM, AND RADIO COMMUNICATION METHOD

BACKGROUND OF THE INVENTION

The present invention relates to an automatic gain control device for an amplifier capable of setting a gain, an automatic gain control method, a control program for an automatic gain control device, a radio communication terminal having an automatic control device, a radio communication system, and a radio communication method and, more particularly, to an automatic gain control device for an amplifier in the reception unit of a radio communication terminal which can switch the frequency of a reception signal in the compressed mode, an automatic gain control method, a control program for an automatic gain control device, a radio communication terminal having an automatic control device, a radio communication system, and a radio communication method.

In general, in a radio communication terminal such as a PHS, a cellular phone, an information terminal, e.g., a PC capable of wireless LAN connection, or a PDA, AGC (Automatic Gain Control) is performed to improve the precision in converting a reception signal (analog signal) into a digital signal.

In general, in a radio communication terminal, the reception signal received at the antenna must be converted into a digital signal. The reception signal is amplified by an amplifier, and then input to an ADC (Analog Digital Converter) which converts an analog signal into a digital signal. A processor or the like then, for example, extracts communication data and control data from the reception signal converted into a digital signal by the ADC and processes them. Information processing for the reception signal is performed by the processor or the like.

Since the resolution of the ADC is fixed, in order to convert an analog signal into a digital signal with high precision by using the limited resolution as much as possible, an input value to the ADC is preferably a value close to the maximum value in the range of input values (dynamic range). If, however, an input value to the ADC exceeds the dynamic range, proper measurement cannot be done. It is therefore also necessary for an input value to the ADC (an output from the amplifier on the input stage of the ADC) not to exceed the maximum value. On the other hand, the strength of a reception signal varies with changes in external environment.

In order to make the input amplitude of the ADC constant by absorbing changes in the strength of reception signals, the gain of the amplifier must be controlled. In this case, control to make the output of the amplifier capable of setting a gain value constant is called automatic gain control, and an automatic gain control device is a control device including an automatic gain control function.

The performance of an automatic gain control device has a great influence on the signal reception characteristics of an overall radio communication terminal. A high-performance automatic gain control device is indispensable to a high-performance radio communication terminal. The radio signal receiver of the radio communication terminal is exposed to abrupt changes in reception environment for radio signals depending on the movement of the terminal itself, the movement of an electric wave obstacle, and the specifications unique to a radio system. The automatic gain control device is required to stably hold a constant amplifier output even at the time of such a change in environment.

Various techniques concerning automatic gain control have currently been proposed.

First, there is available a technique concerning an AGC method in data communication using a frequency-hopping scheme (Japanese Patent Laid-Open No. 2000-236286). A data signal comprises a sync signal and information signal. AGC is operated during the reception of a sync signal, and stopped during the reception of an information signal. This makes it possible to prevent AGC from producing operation noise during the reception of an information signal, and hence prevents the transmission quality from being influenced by noise. After frequency hopping, the gain value of AGC which is stored before frequency hopping is used.

Second, there is available an AGC technique in the TDMA scheme (Japanese Patent Laid-Open No. 2002-076996). The TDMA scheme is a communication scheme of allocating time-divided data to users. If the number of users is small, there is a time-divided area (time slot) in which no data is transmitted. When AGC is operated in a time slot during which no data is transmitted, AGC operates in a direction to increase the degree of amplification because there is no input signal. When the radio receiver receives again a time slot in which data destined to it, the degree of amplification of AGC becomes inappropriate. For this reason, the radio receiver activates AGC only in a time slot in which data destined to itself is stored, but stops activating AGC in other times. The receiver uses the amplifier setting corresponding to the immediately preceding time slot. This makes it possible to obtain a stable amplifier output.

Third, there is available an AGC technique in the TDMA scheme (Japanese Patent No. 3064081). The predicted value of the gain value of AGC is calculated on the basis of the electric field strength of a specific signal in the immediately preceding time slot. Starting AGC by using the predicted value can perform control using a value close to an appropriate gain value from the beginning of AGC.

Fourth, there is available an AGC technique at the time of high-speed data communication in the CDMA/TDD scheme (Japanese Patent Laid-Open No. 2003-124759). The amount of variation in reception power (RSSI) of the immediately preceding time slot within the same frame is measured on the basis of the data rate, ISCP (Interference Signal Code Power) difference, and Doppler frequency. If the variation is large, the gain value of AGC is determined with reference to the RSSI of the immediately preceding time slot. If the variation is small, the gain value of AGC is determined with reference to the RSSI of a corresponding time slot in the immediately preceding frame. This makes it possible to perform control such that the gain value of AGC converges promptly even if a variation in RSSI is large.

Fifth, there is available an AGC technique based on positional information using a GPS system (Japanese Patent Laid-Open No. 2003-209477). A reception signal level is predicted from the distance between the current positional information of an AGC circuit which has been measured by using a GPS system at the start of communication and a known communication partner station. More specifically, a reception signal level is predicted on the basis of distance information, and the gain value of AGC which is suited to the reception signal level is predicted. ACG operation is stabilized by using the predicted optimal gain value of the amplifier.

The WCDMA standard technology includes the compressed mode as a mode unique to the system (e.g., "3GPP TS 25.212 V4.6.0, pp. 52-55" [online], Sep. 27, 2002, 3GPP, [retrieved Mar. 24, 2004], Internet <URL:

http://www.3gpp.org/ftp/Specs/html-info/25212.htm>:

"W-CDMA Mobile Communication Systems", edited by Keiji Tachikawa, Maruzen, Jun. 25, 2001, pp. 140-141). The compressed mode is a technique of preventing a decrease in data transmission amount due to a transmission gap, which is a time zone provided by a radio station at the time of transmission of a radio signal, in which no radio signal is transmitted, by transmitting radio signals obtained by compressing data before and after the transmission gap. In general, the compressed mode is assumed to be used for different frequency monitoring (measuring a radio signal having a frequency different from that of a radio signal received in a normal state) which is required when the radio communication terminal performs handover between stations with different frequencies or performs handover between radio systems with different frequencies.

Owing to demands for reductions in manufacturing cost, size, and the like, a radio receiver mounted in a radio communication terminal corresponds to only one frequency. Therefore, in order to receive radio signals with two different frequencies, the tuning frequency of the radio receiver must be changed.

In this case, consequently, when different frequency monitoring is to be performed by using the compressed mode, the radio communication terminal needs to switch the tuning frequency of the radio receiver. More specifically, the radio communication terminal must change the tuning frequency of the radio receiver from the initial frequency to a monitor target frequency at the occurrence of a transmission gap, and must monitor the electric field level, noise level, signal timing, and the like of the reception signal with the monitor target frequency. When the transmission gap is over, the radio communication terminal must change the tuning frequency of the radio receiver to the initial frequency. On the other hand, according to the WCDMA standard technology specifications, the minimum transmission gap in the compressed mode is very short, only 2 ms.

Although it depends on the specifications set by a management company for a WCDMA system, a radio communication terminal or network generally determines, on the basis of information obtained by a plurality of number of times of different frequency monitoring, whether or not the radio communication terminal performs handover.

The WCDMA standard technology requires a technique of switching the tuning frequency of a radio receiver a plurality of number of times within a short period of time. In addition, since only a short period of time is given for different frequency monitoring, and different frequency monitoring operation must be finished within the period of time, an automatic gain control device is required, which promptly converges to an optimal state and becomes stable immediately after switching of the tuning frequency of the radio receiver.

In the first to fifth techniques, however, no automatic gain control device is disclosed, which is based on the assumption that the tuning frequency of a radio receiver is switched a plurality of number of times in a short period of time. Furthermore, there is not disclosed any technique of performing automatic gain control by predictive computation suitable for the operation of switching the frequency of a reception signal.

SUMMARY OF THE INVENTION

It is an object of the present invention to provide an automatic gain control device, an automatic gain control method, a radio communication terminal, a control method for an automatic gain control device, and a control program for an automatic gain control device which can quickly converge and become stabilized when the tuning frequency of a radio receiver is switched a plurality of number of times in a short period of time as in a case of different frequency monitoring using the compressed mode.

In order to achieve the above object, according to the present invention, there is provided an automatic gain control device comprising an amplifier for a reception signal, which can set a gain, information processing means for extracting control data from an output from the amplifier and performing information processing for the data, storage means for storing a gain setting value of the amplifier, and control means for controlling a gain of the amplifier in accordance with a preset control algorithm, wherein on the basis of a result obtained when the control means computes a gain setting value stored in the storage means in accordance with a preset algorithm, the control means controls the gain of the amplifier in correspondence with operation of switching a frequency of a reception signal, which is accompanied by different frequency monitoring in a compressed mode by the information processing means.

DESCRIPTION OF THE PREFERRED EMBODIMENTS

The best modes of carrying out the present invention will be described mainly on the premise of using the WCDMA standard technology. However, the embodiments do not limit the technical range of the present invention.

First Embodiment

Figure 1:
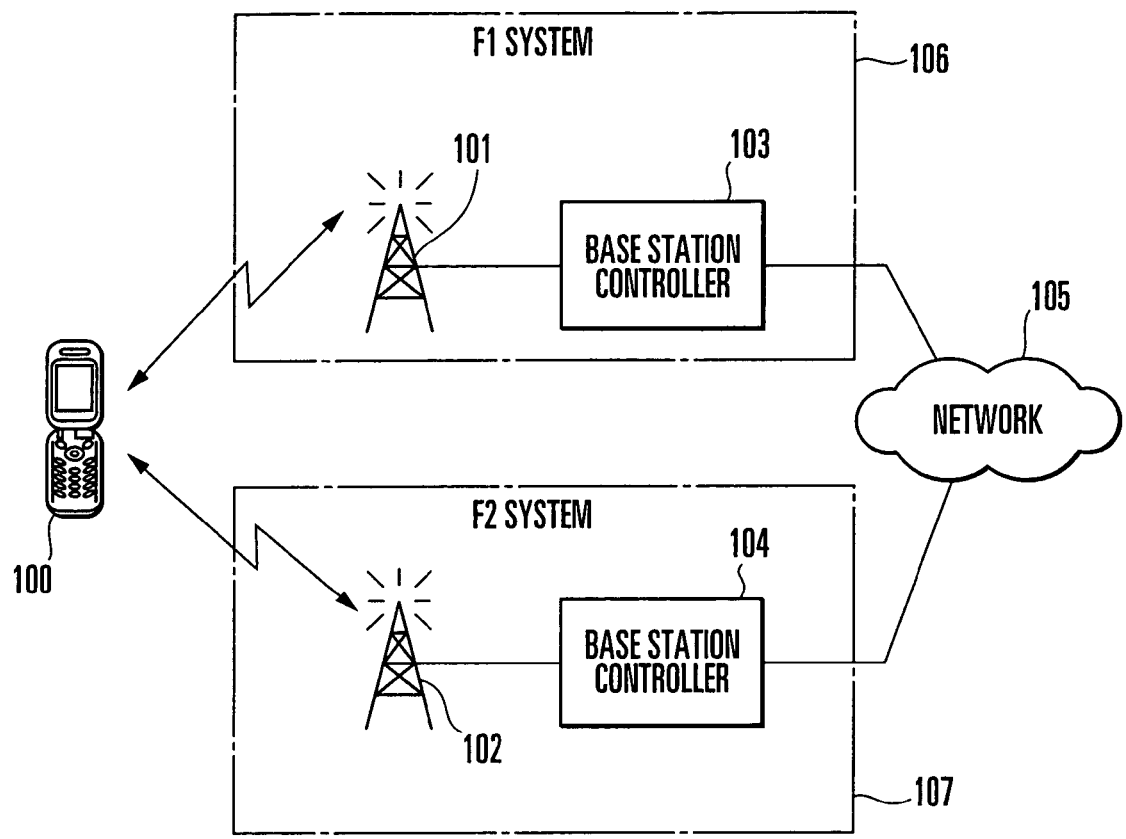
FIG. 1 is a view showing an overall system including a radio communication terminal equipped with an automatic gain control device according to the present invention.

FIG. 1 shows an overall system of the first embodiment which uses a radio communication terminal equipped with an automatic gain control device according to the present invention.

An F1 system 106 comprises a base station 101 and base station controller 103. The base station 101 performs radio communication with the radio communication terminal 100. The base station controller 103 manages the base station 101 and issues control instructions to the radio communication terminal 100. The base station controller 103 also mediates communication between the radio communication terminal 100 and a network 105.

An F2 system 107 comprises a base station 102 and base station controller 104. The base station 102 and base station controller 104 of the F2 system 107 have functions similar to those of the base station 101 and base station controller 103 of the F1 system 106, respectively.

In this case, the two systems are WCDMA radio communication systems using radio signals with different frequencies. In general, the two systems are managed by different persons, and are not subsystems of the same radio communication system which differ only in the unit of base stations to be managed. The two systems can exchange management information about each other's systems through the network 105. Note that when a radio communication terminal 100 is to seamlessly perform handover between the F1 system 106 and the F2 system 107, the information of the radio communication terminal 100 is exchanged between the two systems.

The network 105 is a network including a dedicated line, the Internet, a public telephone network, and the like. By connecting to the network 105, the radio communication terminal 100 can receive communication services such as the service of speech communication with another communication terminal (not shown) connected to the network 105.

In the radio communication terminal or radio receiver 100, an automatic gain control device according to the present invention is applied to the radio reception unit. The radio receiver 100 can communicate/connect with/to both the F1 system 106 and the F2 system 107 by switching its tuning frequency.

Referring to FIG. 1, for the sake of descriptive convenience, each of the F1 system 106 and F2 system 107 includes one base station and one base station controller, but each of the F1 system 106 and F2 system 107 may comprise many base stations and many base station controllers.

Figure 2:
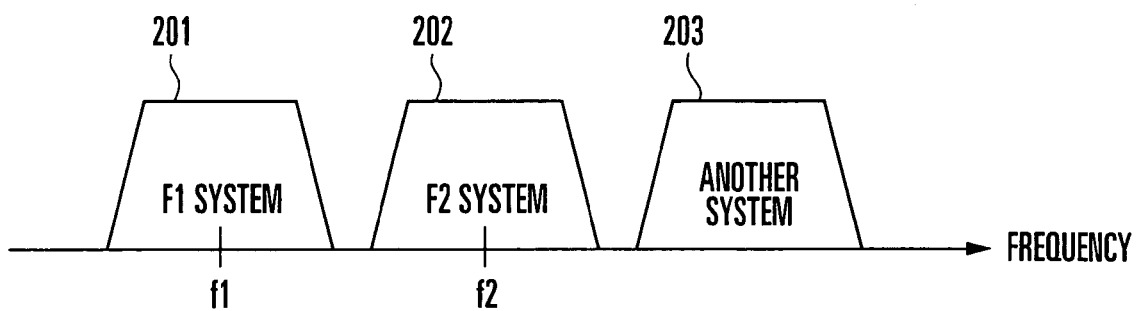
FIG. 2 is a graph showing the locations of frequencies in radio communication.

FIG. 2 shows the frequency bands of radio signals used by the F1 system 106 and F2 system 107. In general, the frequency bands of radio signals to be used by radio communication systems, TV broadcasting, radio broadcasting, and the like are allocated by a government or the like so as not to interfere with each other.

Different frequency bands are allocated to the F1 system 106 and F2 system 107. A frequency band 201 centered on a frequency f1 is allocated to the F1 system 106. A frequency band 202 centered on a frequency f2 is allocated to the F2 system 107. Referring to FIG. 2, although the frequency band 201 is close to the frequency band 202, the frequency bands used by the two systems need not be close to each other in practicing the present invention.

In the description of this embodiment, the radio communication terminal 100 communicates with the F1 system 106 by basically using the frequency band 201, and regards a radio signal in the frequency band 202 of the F2 system 107 as a target for different frequency monitoring. This form is just for the sake of descriptive convenience, and does not exclude a case wherein the radio communication terminal 100 communicates with the F2 system 107 by using the frequency band 202, and regards a radio signal in the frequency band 201 of the F1 system 106 as a target for difference frequency monitoring.

Figure 3:
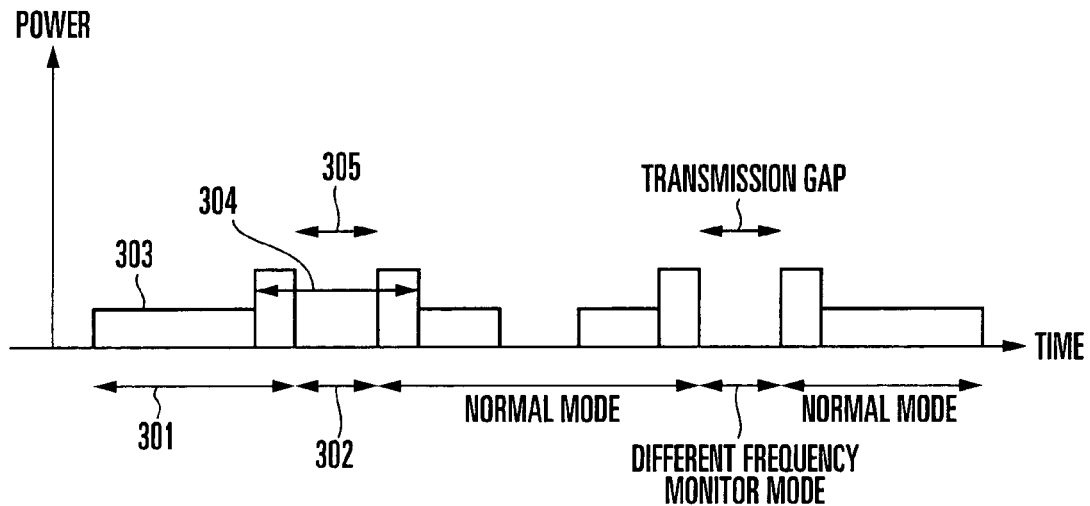
FIG. 3 is a graph showing frames in the compressed mode.

FIG. 3 shows a signal in the compressed mode based on the WCDMA standard technology, which is a radio signal transmitted from the base station 101 to the radio communication terminal 100. The abscissa represents the time; and the ordinate, the power of the radio signal.

There are a normal mode 301 and different frequency monitor mode 302. In the normal mode 301, a radio signal is transmitted from the base station 101. In the different frequency monitor mode 302, the transmission of a radio signal from the base station 101 is stopped.

In the normal mode 301, the radio communication terminal 100 communicates with the base station 101 by radio. A normal frame 303 is a frame of a normal radio signal transmitted from the base station 101 to the radio communication terminal 100.

In the different frequency monitor mode 302, a transmission gap 305 occurs, and no radio signal is transmitted from the base station 101 to the radio communication terminal 100. During the transmission gap 305, the radio communication terminal 100 changes the tuning frequency of the radio receiver from the frequency band 201 of the F1 system 106 to the frequency band 202 of the F2 system 107, and measures the radio signal in the frequency band 202.

In a frame 304, the transmission power is temporarily increased to prevent a deterioration in communication quality.

In the compressed mode in the WCDMA standard technology, a plurality of transmission gaps generally occur at intervals, as shown in FIG. 3.

Different frequency monitoring by the radio communication terminal 100 using the compressed mode is performed in accordance with an instruction from the base station controller 103. That is, the base station 101 notifies the radio communication terminal 100 of information such as the occurrence time and duration of the compressed mode and the frequency of a radio signal to be monitored after switching.

Figure 4:
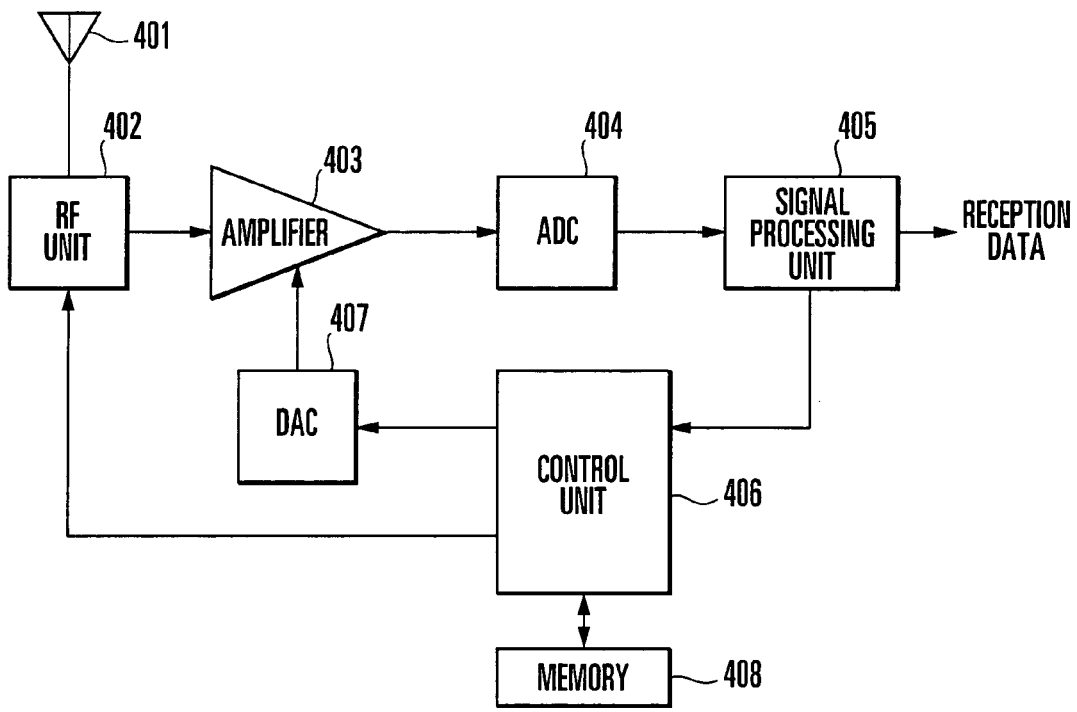
FIG. 4 is a block diagram showing the arrangement of the main part of an automatic gain control device according to the present invention.

FIG. 4 shows the arrangement of the radio signal reception unit of the radio communication terminal 100 to which the automatic gain control device according to the present invention is applied.

An antenna 401 is a reception antenna for a radio signal.

An RF unit 402 is a radio receiver, which comprises a filter, amplifier, oscillator, and the like. The RF unit 402 relays a reception signal from the antenna 401 to an amplifier 403.

The amplifier 403 is an amplifier which can set a gain value, and amplifies the reception signal received from the RF unit 402 on the basis of the gain setting value set by an output from a DAC (Digital Analog Converter) 407.

An ADC 404 converts an output from the amplifier 403 into a digital signal and outputs it to a signal processing unit 405 on the output stage.

The signal processing unit 405 processes the digital signal output from the ADC 404. More specifically, the signal processing unit 405 extracts control data and communication data contained in the reception signal and outputs control data of the control data which is associated with the automatic gain control device to a control unit 406. The signal processing unit 405 outputs the remaining data, i.e., the communication data and control data, to a circuit unit (not shown) on the output stage. The circuit unit on the output stage includes, for example, a control unit for a speaker and display. The control unit outputs a voice from the speaker on the basis of data of the communication data which is associated with the voice, and displays an image on the display on the basis of data of the communication data which is associated with the image.

The control unit 406 receives part of the control data from the signal processing unit 405, and performs various kinds of computation processing on the basis of the received control data, and then sets the output value of the DAC 407. In this case, the control data which the control unit 406 receives from the signal processing unit 405 includes at least data associated with the amplitude of the output of the amplifier 403 and data associated with the occurrence of the compressed mode. The data associated with the compressed mode includes, for example, the occurrence time of a transmission gap, the occurrence timing of a transmission gap, the type of system (e.g., WCDMA, GSM, or IS-95) as a target for different frequency monitoring, and the frequency of a radio signal as a target for different frequency monitoring. The control unit 406 is connected to the RF unit 402, and controls the operation of switching the tuning frequency of the RF unit 402.

A memory 408 is a storage device which stores the frequency of a reception signal, the gain setting value of the amplifier 403 which corresponds to the reception signal, and the initial value of the gain setting value used for automatic gain control on the amplifier 403.

The basic operation of the automatic gain control device shown in FIG. 4 will be described next.

A radio signal is received by the antenna 401 and input to the amplifier 403 through the RF unit 402. The amplifier 403 amplifies the reception signal in accordance with the gain set by the DAC 407 and outputs the resultant signal to the ADC 404. The reception signal converted from an analog signal into a digital signal by the ADC 404 is input to the signal processing unit 405. The signal processing unit 405 extracts data from the signal, and outputs control data such as data associated with the amplitude of the output of the amplifier 403 and data associated with the occurrence of the compressed mode to the control unit 406, while outputting the remaining data to the output stage.

The control unit 406 controls the output of the DAC 407 so as to make the output of the amplifier 403 constant on the basis of the control data received from the signal processing unit 405. If the output of the amplifier 403 is smaller than an optimal value, the control unit 406 changes the output of the DAC 407 in a direction to increase the gain of the amplifier 403. If the output of the amplifier 403 increases beyond the optimal value, the 406 changes the output of the DAC 407 in a direction to decrease the gain of the amplifier 403. When the frequency of a radio signal to be received is to be switched, switching control is performed for the tuning frequency of the RF unit 402. This control will be described in detail later.

Figure 5:
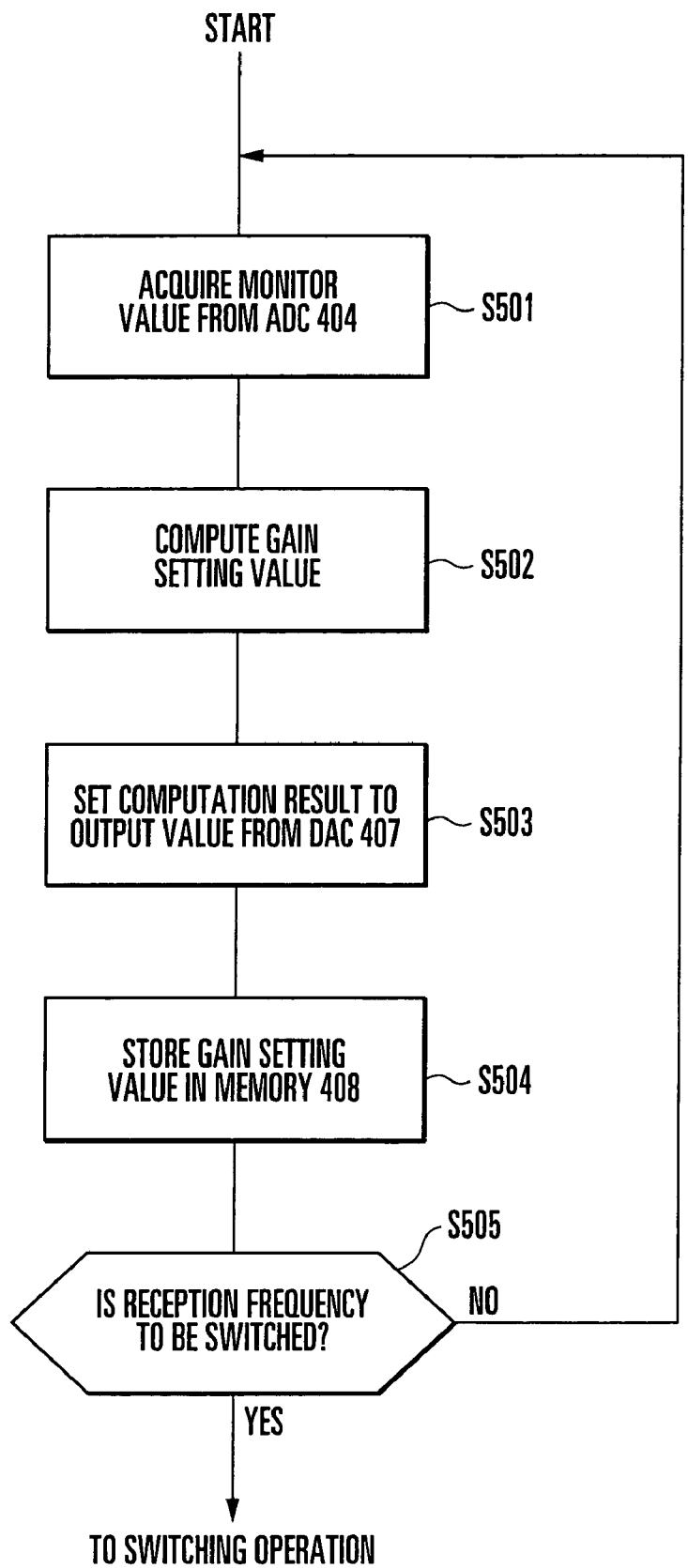
FIG. 5 is a flowchart of automatic gain control according to the present invention.

FIG. 5 shows the operation of a control loop in the automatic gain control device according to the present invention. Note that the control unit 406 manages each process shown in FIG. 5.

At the start, the automatic gain control device starts operation. Automatic gain control is started when automatic gain control on the amplifier 403 is newly started as in a case wherein the power supply of the radio communication terminal 100 is turned on or different frequency monitoring is started. In this case, at the start of automatic gain control, the initial value of a gain setting value must be set in advance. This is because some gain setting value must be input to the amplifier 403 in advance. For example, in order to reliably prevent the output of the amplifier 403 from being saturated, the gain setting value of the amplifier 403 is set to 0 at the start of automatic gain control. In addition to this value, various initial values such as a median value, minimum value, or maximum value in the gain setting range of the amplifier 403 can be set.

At the end of frequency switching operation to be described later with reference to FIG. 6, the initial value of the gain setting value used at the start of automatic gain control is an initial gain setting value or the predicted gain setting value obtained by predictive gain computation. At times other than the end of frequency switching operation, the initial value of the gain setting value is the initial value of the gain setting value acquired from the memory 408. This will be described in detail later.

When this sequence is started, the control unit 406 acquires a monitor value from the ADC 404 (S501). In practice, the control unit 406 acquires a digitized monitor value from the ADC 404 through the signal processing unit 405.

The control unit 406 performs gain value computation on the basis of the monitor value from the ADC 404 (S502). With this computation, an output setting value (output) from the DAC 407 is determined from the monitor value (input) from the ADC 404. This computation is control computation, which is generally performed to decrease the output of the DAC 407 when the monitor value from the ADC 404 is larger than the optimal value set in advance, and to increase the output of the DAC 407 when the monitor value is smaller than the optimal value. An example of the control computation is proportional computation, by which the DAC output is increased/decreased in proportion to the error between an optimal value and a measured value. In addition, the control computation includes PI computation, PID computation, and the like to be performed in consideration of the time constant of the control system.

Various kinds of parameters for gain value computation are set on the basis of the feedback amount of the control loop, the time constant, and the instruction contained in control data from the signal processing unit 405. The characteristics of the control loop of automatic gain control are determined by these computation parameters.

The control unit 406 sets the computation result to an output value from the DAC 407 (S503). The output of the DAC 407 is updated on the basis of a setting value. The output of the DAC 407 is set as the gain setting value of the amplifier 403, thus controlling the gain of the amplifier 403.

The current frequency (frequency band 201) of the reception signal and the gain setting value of the amplifier 403 are stored in the memory 408 (S504). In this case, the stored frequency of the reception signal and the gain setting value of the amplifier 403 which corresponds to the reception signal are used for predictive computation of a gain setting value when a reception signal in the frequency band 201 is to be received. Note that the gain setting value of the amplifier 403 is additionally stored without overwriting old data as long as the capacity of the memory 408 allows. This is because storing a larger number of gain setting values will be advantageous for predictive computation of an optimal gain setting value, which will be described later. If the capacity of the memory 408 does not allow additional storage, data may be overwritten. Even in this case, sequentially overwriting older stored data or overwriting gain setting values in order of decreasing numbers of values corresponding to the same frequency will be advantageous for predictive computation of an optimal gain setting value to be described later.

The control unit 406 then determines the necessity to switch the reception frequency (S505). As described above, the base station 101 notifies the radio communication terminal 100 of information associated with the compressed mode. The signal processing unit 405 extracts the notified information, and the control unit 406 acquires it, thereby allowing the control unit 406 to determine whether or not to perform reception signal switching operation.

If the tuning frequency of the RF unit 402 need not be switched, the flow returns to the step of acquiring a monitor value from the ADC 404 (S501), and processing similar to that described above is repeated. That is, each process in the control loop shown in FIG. 5 is repeated so as to make a monitor value from the DAC 407 become an optimal value unless the tuning frequency of the RF unit 402 is switched.

If the tuning frequency of the RF unit 402 needs to be switched, the flow shifts switching operation.

According to the above description, in step S505, the control unit 406 determines the necessity to switch the reception frequency. However, the flow may shift to switching operation in response to an interrupt signal (not shown) as a trigger from the signal processing unit 405. In this case, the control unit 406 may make software or hardware interrupt setting in advance on the basis of control data from the signal processing unit 405.

The control loop shown in FIG. 5 has exemplified the form of shifting to the operation of acquiring a monitor value from the ADC 404 immediately after the determination in step S505. However, in order to make control cycles constant, the flow may wait in an infinite loop until an interruption is caused by a timer which manages control cycles. In this form, the flow shifts to the operation of acquiring a monitor value from the ADC 404 in response to a timer interruption.

In addition, the control loop in FIG. 5 has exemplified the form in which the control unit 406 acquires a monitor value from the ADC 404 from the signal processing unit 405. However, the signal processing unit 405 may periodically notify the control unit 406 of a monitor value from the ADC 404.

The storage processing of a gain setting value in the memory 408 has been described as a form of being performed once per execution of the control loop shown in FIG. 5. However, this processing may be implemented in other forms. More specifically, such forms include a form of storing gain setting values in the memory 408 at constant time intervals irrelevant to the cycle of a control loop, a form of storing a gain setting value in the memory 408 when a monitor value from the ADC 404 abruptly changes, a form of storing a gain setting value in the memory 408 upon shortening the time intervals for storage in the memory 408 when a monitor value from the ADC 404 abruptly changes, and a form of storing time information together with a gain setting value. As described with reference to step S504 described above, according to a preferable form of storage, data are additionally stored in the memory instead of overwriting of old data. Even if old data are to be overwritten, data are preferably overwritten and erased in order of priority.

Although the form of shifting to the reception frequency switching operation on the basis of the determination result in step S504, the control unit 406 may set in advance a timer interrupt corresponding to the occurrence time of the compressed mode, and the flow may shift to the switching operation upon occurrence of the interrupt.

Figure 6:
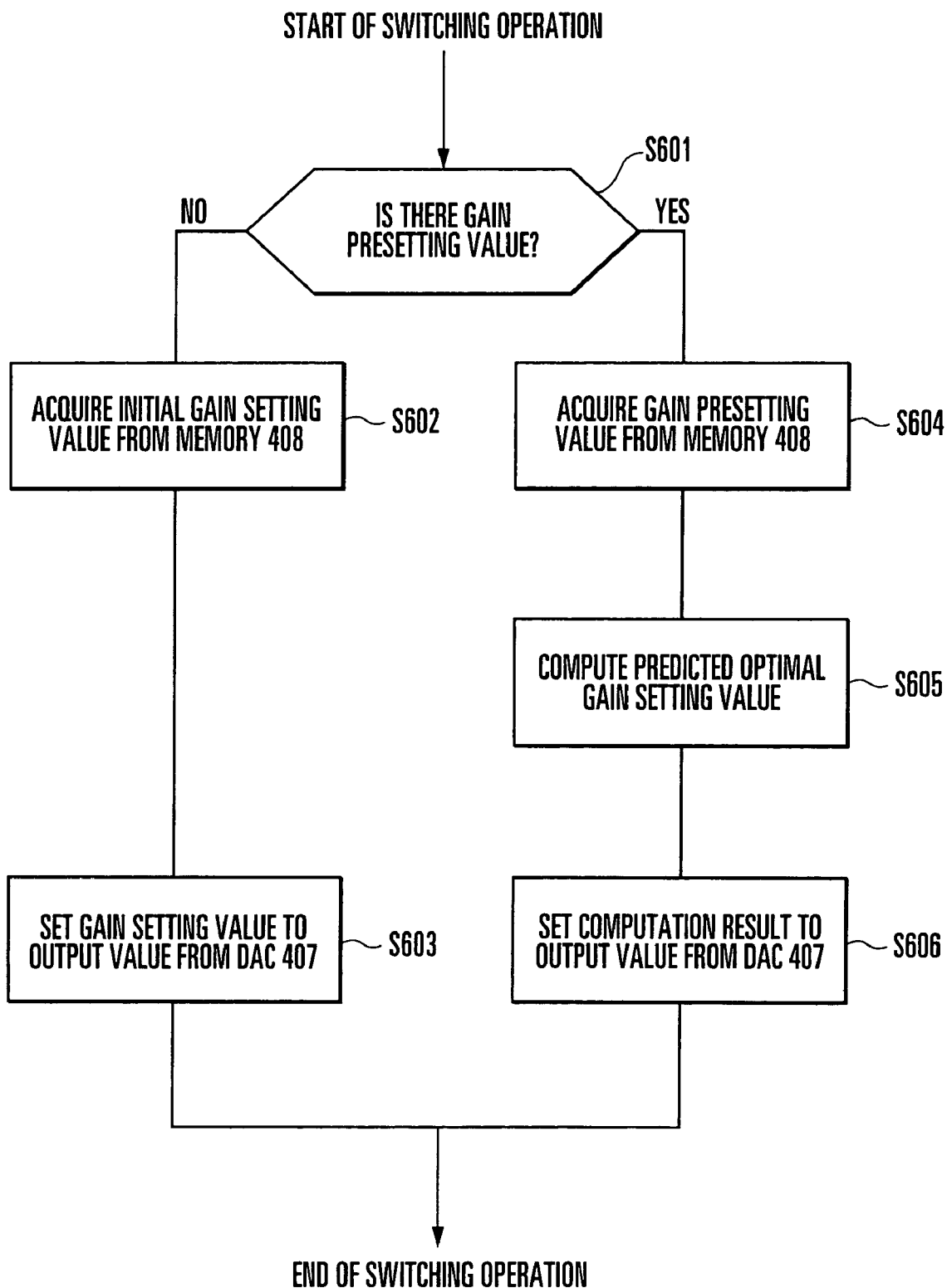
FIG. 6 is a flowchart showing operation to be performed when reception frequency switching is performed in automatic gain control according to the present invention.

FIG. 6 is a flowchart expressing the main part of the operation of switching the tuning frequency of the RF unit 402. In this case as well, the following description is based on the assumption that the tuning frequency of the radio communication terminal is switched from the frequency band 201 of the F1 system 106 to the frequency band 202 of the F2 system 107. Note that the control unit 406 manages each process.

When the switching operation starts, the control unit 406 determines whether or not the gain setting value of the amplifier 403 which corresponds to the reception signal of the frequency after switching is stored in the memory 408 (S601). In the following description, the preset value of gain setting value (or a gain presetting value) is the gain setting value of the amplifier 403 which corresponds to a reception signal of a frequency after switching, and is stored in the memory 408. Note that one or a plurality of gain presetting values may be regarded as targets which are to be checked by the control unit 406 whether they are stored in the memory 408.

If the gain setting value of the amplifier 403 which corresponds to the reception signal of the frequency after switching is not stored (NO in step S601), the control unit 406 acquires the initial value of the gain setting value of the amplifier 403 from the memory 408 (S602). The initial value of a gain setting value is set in advance to various values, e.g., a median value and minimum value in the gain setting range of the amplifier 403, depending on the design concept.

The initial value of the gain setting value acquired by the control unit 406 is set to an output value from the DAC 407 (S603). After switching operation, the DAC 407 outputs the output set by the control unit 406 to the amplifier 403. Thereafter, normal automatic gain control in FIG. 5 is started.

If the gain setting value of the amplifier 403 which corresponds to the reception signal of the frequency after switching is stored (YES in step S601), the control unit 406 acquires the gain presetting value of the amplifier 403 from the memory 408 (S604).

The control unit 406 then performs predictive computation of an optimal gain setting value by using the gain presetting value in accordance with a predetermined algorithm. The details of the algorithm will be described later.

The optimal gain setting value of the amplifier 403 which is obtained by predictive computation is set to the DAC output value (S606), and the switching operation is finished. The DAC 407 outputs the output set by the control unit 406 to the amplifier 403. The amplifier 403 operates with the set gain value. After the switching operation, normal automatic gain control in FIG. 5 is started.

If an ADC monitor value is acquired immediately after the switching operation (S501), a monitor value for the output of the amplifier 403 before the setting value is reflected in the DAC output or before the amplifier 403 operates with the set gain value may be acquired. If such a problem arises, control in FIG. 5 may be resumed a predetermined period of time after the end of the switching operation.

The algorithm for calculating an optimal gain setting value from a gain presetting value will be described below.

Gain setting values of the amplifier 403 which correspond to radio signals in the frequency band 201 of the F1 system 106 are stored in advance in the memory 408 at predetermined time intervals. The amount of change in gain setting value per unit time is calculated from these gain presetting values.

Assuming that a change in gain setting value corresponding to the frequency band 201 exhibits the same tendency as a change in gain setting value calculated above even in a time during which a radio signal in the frequency band 202 of the F2 system 107 is monitored (during this time, no radio signal in the frequency band 201 is received), an optimal gain setting value corresponding to the frequency band 201 after a return from different frequency monitoring is calculated.

That is, optimal gain setting value=gain setting value which corresponds to frequency band 201 and is stored last+ amount of change in gain setting value per unit time×monitoring time. In the case wherein the tendency of a change in gain setting value corresponding to the frequency band 201 is calculated, a time width to be extracted as a sample may be a fixed value or a variable value. In the case of a fixed value, for example, the time width is set to 3 sec immediately close to the switching operation of the RF unit 402, and the tendency of a change in gain setting value of a reception signal in the frequency band 201 is calculated from gain setting values stored in 3 sec immediately close to the switching operation.

When a variable value is used, a good effect can be obtained by setting, as a sample extraction time, the time interval from the instant at which the tendency of a change in gain setting value changes and the instant immediately before the frequency switching operation of the RF unit 402.

It is conceivable that the tendency of a change in gain setting value changes when the tendency of a change in reception sensitivity with respect to a radio signal from the base station 101 changes because of a change in the moving direction or moving speed of the radio communication terminal 100 or the like. Therefore, calculating the tendency of a change in gain setting value by using a gain setting value sample after a change in the tendency of a change in environment for the radio communication terminal 100 will reflect reality more than calculating the tendency of a change in gain setting value by using a gain setting value sample before a change in the tendency of a change in environment, and hence is more effective. Alternatively, a sample extraction time may be determined on the basis of the free space of the memory 408.

Figure 7:
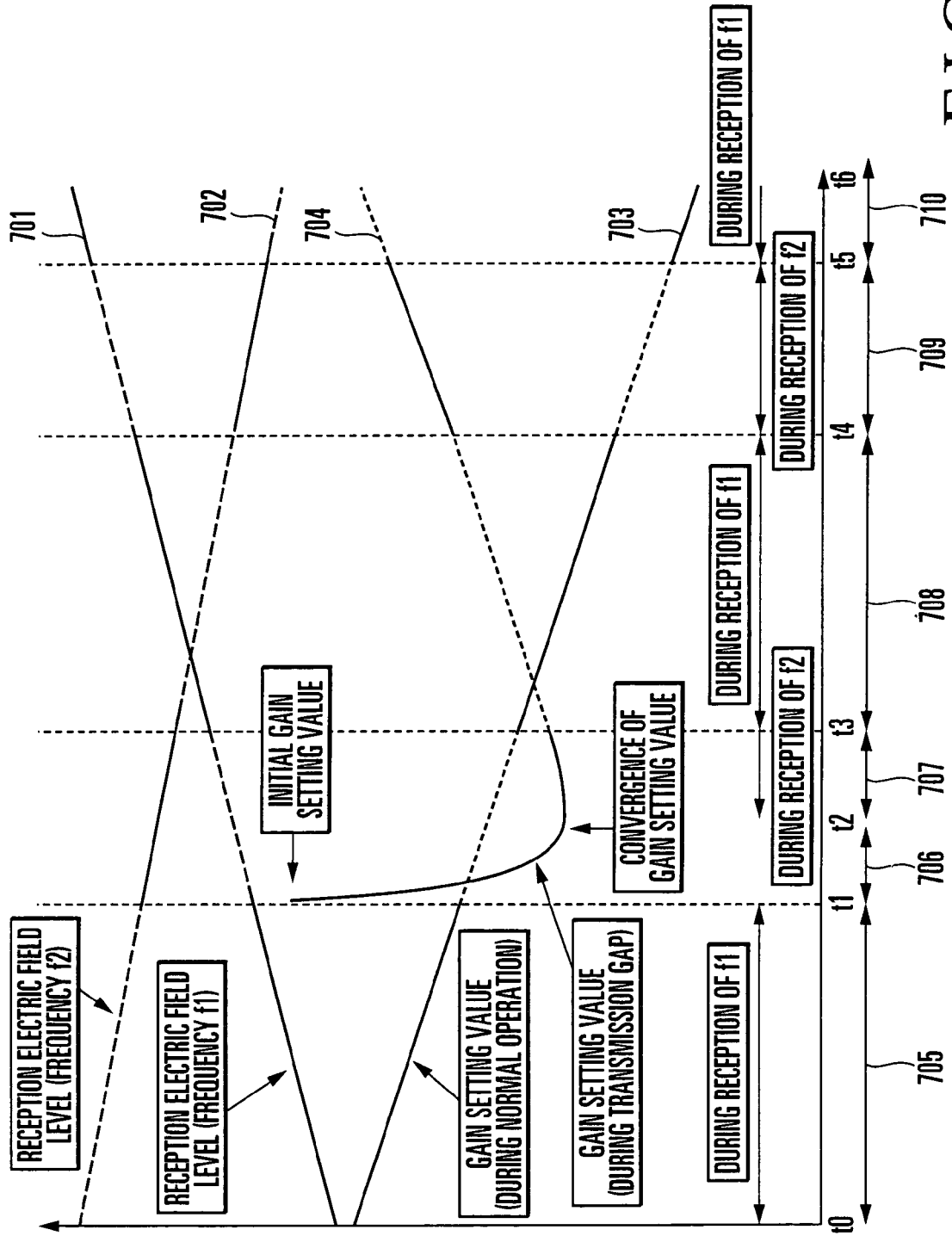
FIG. 7 is a timing chart showing the operation of the automatic gain control device of the present invention.

FIG. 7 shows the relationship between the operation of the radio communication terminal 100 equipped with the automatic gain control circuit according to this embodiment and the electric field level of the radio system. FIG. 7 shows how the radio communication terminal 100, which has established radio communication with the F1 system 106, performs different frequency monitoring on the basis of an instruction from the base station controller 103 of the F1 system 106.

An electric field level 701 is the reception electric field level of a radio signal in the frequency band 201 from the F1 system 106, which is received by the radio communication terminal 100. Note that the broken lines represent estimated values.

An electric field level 702 is the reception electric field level of a radio signal in the frequency band 202 from the F2 system 107, which is received by the radio communication terminal 100. Note that the broken lines represent estimated values.

A gain setting value 703 is the gain setting value of the amplifier 403 of the automatic gain control device in a case wherein the radio communication terminal 100 receives a radio signal in the frequency band 201.

A gain setting value 704 is the gain setting value of the amplifier 403 of the automatic gain control device in a case wherein the radio communication terminal 100 receives a radio signal in the frequency band 202.

In time zones 705, 708, and 710, the radio communication terminal 100 has received a radio signal (f1) in the frequency band 201. In time zones 706, 707, and 709, the radio communication terminal 100 has received a radio signal (f2) in the frequency band 202.

Operation in the time zone (time zone 705) between time t0 and time t1 will be described first. The radio communication terminal 100 has received a radio signal in the frequency band 201 with a center frequency f1, and the RF unit 402 of the automatic gain control device is tuned to the frequency f1. In this case, the electric field level 701 increases with time as, for example, the radio communication terminal 100 moves. Since the automatic gain control device controls output values from the amplifier 403 to become constant, the gain setting value of the amplifier 403 decreases as the electric field level 701 increases (S703).

Operation in the time zones (time zones 706 and 707) between time t1 and time t3 will be described next. At time t1, the radio communication terminal 100 switches the tuning frequency of the RF unit 402 from f1 to f2 in accordance with the compressed mode. Thereafter, the radio communication terminal 100 starts control to optimize the gain setting value of the amplifier 403 with respect to the reception signal with the frequency f2.

At time t1, since there is no gain presetting value corresponding to the frequency f2 in the memory 408, the control unit 406 starts automatic gain control by using the initial value of the gain setting value stored in the memory 408 in advance (see FIG. 6). In the case shown in FIG. 7, at time t1, since the initial gain setting value is larger than the optimal value for the electric field level 702, the amplifier 403 outputs a value larger than the target value. Thereafter, the gain setting value of the amplifier 403 converges to an optimal value owing to automatic gain control by the control unit 406 (time zone 706).

Owing to automatic gain control, at time t2, the gain setting value of the amplifier 403 almost converges to the optimal value. Thereafter, owing to automatic gain control, the electric field level 702 decreases, and at the same time, the gain setting value 704 increases.

Operation in the time zone (time zone 708) between time t3 and time t4 will be described next.

At time t3, the radio communication terminal 100 switches from the operation of receiving the frequency f2 to the operation of receiving the frequency f1 after the end of the compressed mode. More specifically, the control unit 406 of the automatic gain control device switches the tuning frequency of the RF unit 402 from f2 to f1, and starts control to optimize the gain setting value of the amplifier 403 with respect to the reception signal with the frequency f1.

At time t3, since there is a gain setting value corresponding to the frequency f1 in the memory 408, the control unit 406 performs predictive computation of an optimal gain setting value from the gain presetting value in accordance with the predetermined algorithm described above, thereby starting automatic gain control by using the gain setting value obtained by the predictive computation. After time t3, automatic gain control quickly converges and becomes stabilized.

Operation in the time zone (time zone 709) between time t4 and time t5 will be described next.

At time t4, the radio communication terminal 100 switches from the operation of receiving the frequency f1 to the operation of receiving the frequency f2 at the start of the compressed mode. More specifically, the control unit 406 of the automatic gain control device switches the tuning frequency of the RF unit 402 from f1 to f2, and starts control so as to optimize the gain setting value of the amplifier 403 with respect to the reception signal with the frequency f2.

As in the case of the operation at time t3, starting automatic gain control by using the gain presetting value makes it possible to allow automatic gain control to quickly converge and become stabilized.

Since operation in the time zone (time zone 710) between time t5 and time t6 is the same as that in the time zone 708 described above, a description thereof will be omitted to avoid redundancy.

Second Embodiment

Figure 8:
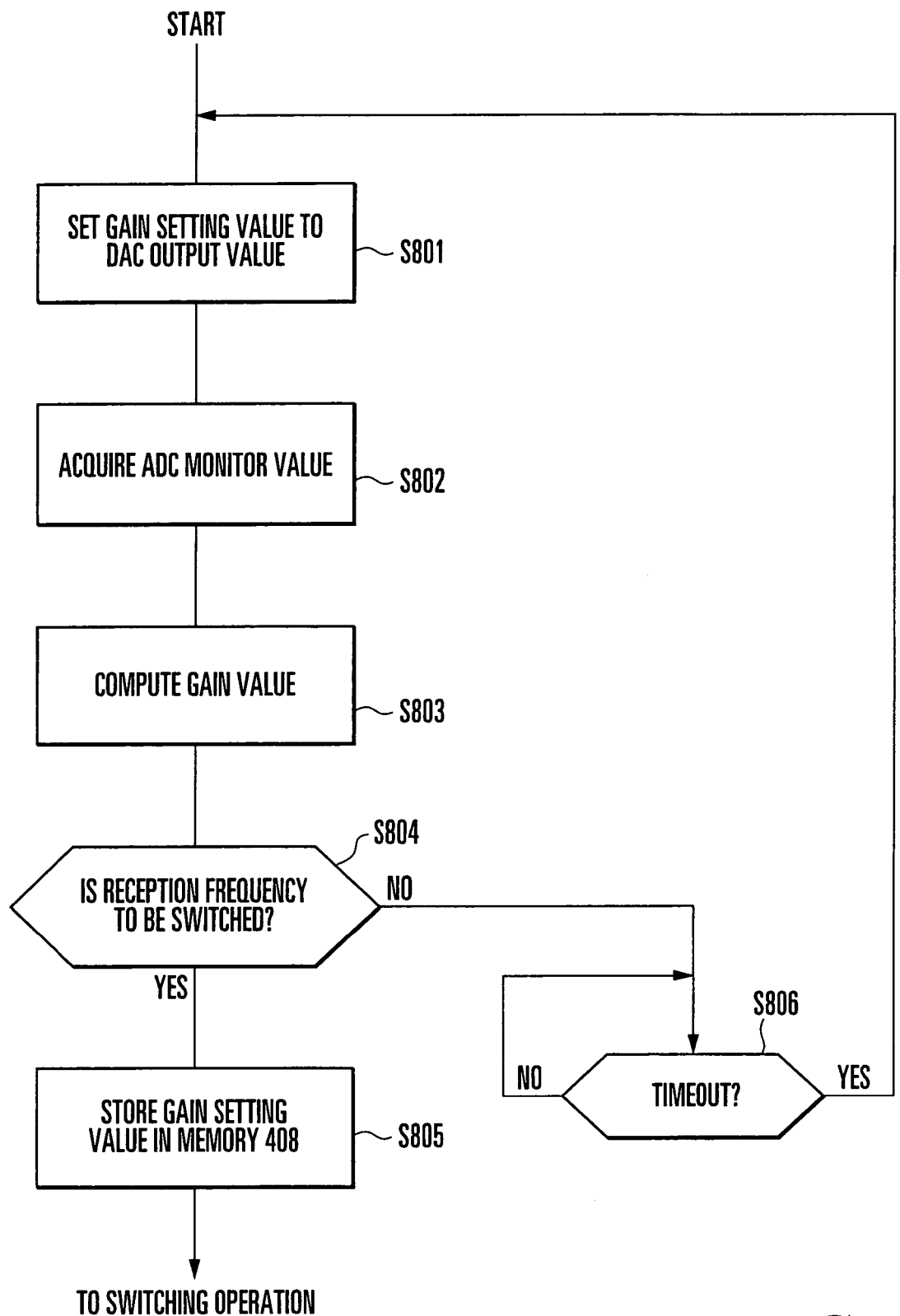
FIG. 8 is a flowchart of automatic gain control according to the second embodiment of the present invention.

The second embodiment will be described. FIG. 8 shows operation in a control loop in an automatic gain control device according to the second embodiment. This is a variation of the control loop in FIG. 5. The same points as those in the first embodiment are the same in content, and hence a description thereof will be omitted to avoid redundancy.

The main difference from the control loop in FIG. 5 is the order of output processing (S801) by a DAC 407, monitor value acquisition processing (S802) by an ADC 404, and gain value computation (S803). Control cycle management (S806) based on timer interruptions is the same as that described as a variation in the first embodiment.

In this embodiment, control cycle management based on timer interruptions is executed in step S806. Since output value setting in the DAC 407 (S801) is performed immediately after an interruption, the update timing of an output from the DAC 407 is always kept constant, thereby stabilizing the control loop.

Note that it is inappropriate to perform output value setting for the DAC 407 (S801) after processing whose computation processing time varies depending on input data like predictive computation in step S803. From this point of view as well, it is appropriate to perform output value setting for the DAC 407 (S801) immediately after an interrupt.

Note that since it is not conceivable that the processing time for determination of reception frequency switching (S804) varies, timer interrupt processing may be performed before step S804. In addition, when a computation algorithm in which variations in processing time for gain value computation are small is to be used, output value setting for the DAC 407 (S801) may be performed after gain value computation (S802).

Third Embodiment

The third embodiment will be described. The third embodiment is a variation of the algorithm for calculating an optimal gain setting value after the tuning frequency of an RF unit 402 is switched. The algorithm in this embodiment is based on the assumption that when the reception electric field level of a radio signal before switching of the tuning frequency of the RF unit 402 varies, the reception electric field level of a radio signal after switching of the tuning frequency of the RF unit 402 also varies accordingly. Since this embodiment is the same as the first embodiment except for this algorithm, a description thereof will be omitted to avoid redundancy. This embodiment will be described below.

Figure 9:
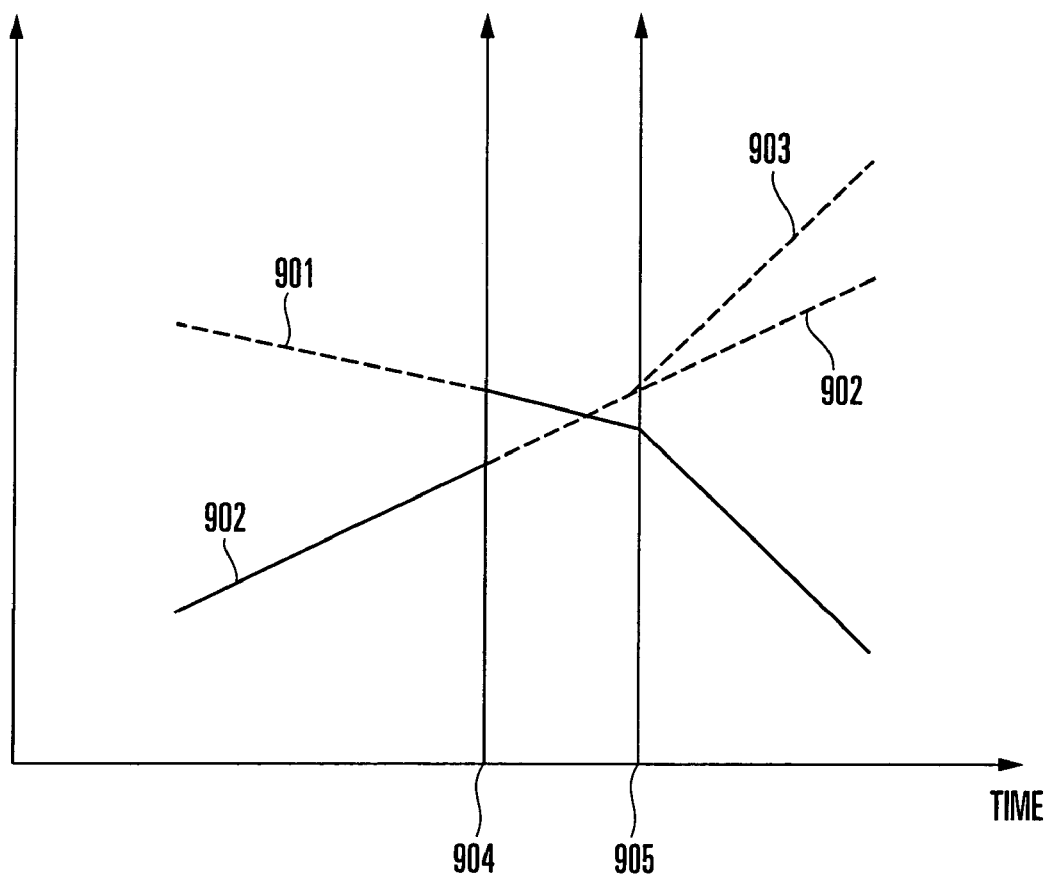
FIG. 9 is a timing chart showing the operation of an automatic gain control device according to the third embodiment of the present invention.

FIG. 9 shows how the third embodiment operates.

A gain setting value 901 corresponds to a radio signal in a frequency band 201. A gain setting value 902 corresponds to a radio signal in a frequency band 202. The solid lines represent gain setting values based on measured values. The broken lines represent gain setting values based on prediction.

The tuning frequency of the RF unit 402 remains in the frequency band 201 until time 904. A control unit 406 changes the tuning frequency of the RF unit 402 from the frequency band 201 to a frequency band 202 at time 904. At time 905, the reception sensitivity of the frequency band 202 varies, and the gain setting value of an amplifier 403 which corresponds to the frequency band 202 decreases in the manner shown in FIG. 9 owing to automatic gain control.

At time 905, the control unit 406 changes the predicted value of the gain setting value of the amplifier 403 which corresponds to the frequency band 201 in the manner indicated by "903" in correspondence with variations in the gain setting value of the amplifier 403 which corresponds to the frequency band 202.

Consider here the amount of reflection of the amount of change in the gain setting value of the amplifier 403 which corresponds to the frequency band 202 in the predicted value of the gain setting value of the amplifier 403 which corresponds to the frequency band 201. If the gain setting value of the amplifier 403 which corresponds to the frequency band 201 and that of the amplifier 403 which corresponds to the adjacent frequency band 202 change in the same direction in terms of sign, the amount of reflection is preferably in the same direction as that of the amount of change. If the gain setting value of the amplifier 403 which corresponds to the frequency band 201 and that of the amplifier 403 which corresponds to the adjacent frequency band 202 change in different directions in terms of sign, the amount of reflection is preferably in a direction opposite to that of the amount of change.

More specifically, as shown in FIG. 9, assume that the gain setting value corresponding to the frequency band 201 tends to increase at a time before time 904, and the gain setting value corresponding to the frequency band 202 tends to decrease at a time after time 905. In this case, when the gain setting value corresponding to the frequency band 202 further decreases at time 905, the predicted value of the gain setting value corresponding to the frequency band 201 is corrected in a direction to increase.

This is because, since base stations 101 and 102 are generally established in physically different places, when the reception electric level of a radio signal varies as a radio communication terminal 100 moves, it is most possible that the terminal moves away from or toward both the base station 101 and the base station 102, or moves toward one of the base stations 101 and 102 while moving away from the other.

In the first to third embodiments, it is assumed that the tendency of change before different frequency monitoring continues (i.e., linear approximation). In this embodiment, when the tendency of change in gain setting value before monitoring is calculated, an approximation is performed by using nth-order curve (n is a natural number). The value of n may be determined in accordance with a balance with the computation amount. Performing an approximation with an nth-order curve makes it possible to realize an approximation more accurate than linear approximation.

As another variation, a form of filtering the gain setting value stored in the memory 408 can be implemented. Since a reception signal contains noise mixed in the signal in the form of a radio signal, a noise component is reflected in a gain setting value based on automatic gain control. Removing this noise component by a filter makes it possible to obtain a more accurate tendency of change in gain setting value without any noise component.

The first to third embodiments have been described on the basis of the WCDMA standard technology. However, the present invention is not limited to these embodiments, and can be effectively applied to a system in which reception frequency switching operation is performed a plurality of number of times.

The first to third embodiments have exemplified different frequency monitoring between the two systems, i.e., the F1 system 106 and the F2 system 107. However, the present invention may be applied to a system in which reception frequency switching operation is performed between a plurality of radio communication systems including radio communication systems other than the above systems.

In the first to third embodiments, both the F1 system 106 and the F2 system 107 have been described as WCDMA radio communication systems. However, one or both of the systems may be different radio communication systems such as GSMs. In other words, the present invention can be applied to a system in which an automatic gain control device is stopped and restarted to receive radio signals with different frequencies.

In addition, the gain setting value of the amplifier 403 immediately before different frequency monitoring may be used as that of the amplifier 403 immediately after different frequency monitoring without any change. This shortens the time required for predictive computation of a gain setting value as compared with the case wherein predictive computation of an optimal gain setting value is performed.

According to the present invention, the automatic gain control device can perform control which quickly converges and becomes stabilized even under a situation in which the tuning frequency of a radio receiver is switched a plurality of number of times within a short period of time as well as when different frequency monitoring is performed by using the compressed mode used in the WCDMA standard technology.

The use of the method using an optimal gain setting value obtained by predictive computation makes it possible to realize automatic gain control which quickly converges and becomes stabilized without making the control circuit shorten the control cycle.

After the frequency of a reception signal is switched by the automatic gain control device which can quickly converge, different frequency monitoring can be performed quickly. In addition, since different frequency monitoring can be started quickly, the time during which different frequency monitoring is prolonged, and the number of times frequency switching control is performed can be reduced. In addition, the time required for overall different frequency monitoring can be shortened. Furthermore, reducing the number of times of frequency switching operation can reduce the number of times of processing and communication performed by the network and the radio communication terminals.

Owing to the automatic gain control device which can quickly converge, the radio communication terminal quipped with the automatic gain control device according to the present invention can shorten the wait time for the start of a service such as speech communication.

The radio communication terminal equipped with the automatic gain control device according to the present invention which can quickly converge can easily and reliably perform handover between base stations with different frequencies in the same radio system or between base stations with different frequencies in different radio systems.

What is claimed is:

1. An automatic gain control device characterized by comprising:
    an amplifier for a reception signal, which can set a gain;
    information processing means for extracting control data from an output from said amplifier and performing information processing for the data;
    storage means for storing a gain setting value of said amplifier; and
    control means for controlling a gain of said amplifier in accordance with a preset control algorithm,
    wherein on the basis of a result obtained when said control means computes the gain setting value stored in said storage means in accordance with the preset algorithm, said control means controls the gain of said amplifier in correspondence with operation of switching a frequency of a reception signal, which is accompanied by different frequency monitoring in a compressed mode by said information processing means,
    wherein the preset algorithm comprises an algorithm for predicting an optimal value of a gain setting value for a first reception signal after different frequency monitoring on the basis of an amount of change in gain setting value of the first reception signal before different frequency monitoring and an amount of change in gain setting value for a second reception signal during different frequency monitoring.

2. A device according to claim 1, wherein said control means stores the gain setting value of said amplifier in said storage means at predetermined time intervals.

3. A device according to claim 1, wherein said control means stores the gain setting value of said amplifier in said storage means every time a frequency of a reception signal is switched.

4. A device according to claim 1, wherein said control means stores the gain setting value of said amplifier in said storage means at time intervals corresponding to a degree of variation in gain setting value of said amplifier.

5. A device according to claim 1, wherein the preset algorithm comprises an algorithm for computing a gain setting value of said amplifier on the basis of a change in gain setting value stored in said storage means.

6. A device according to claim 1, wherein the preset algorithm comprises an algorithm for predicting an optimal value of a gain setting value for a first reception signal after different frequency monitoring by using an amount of change in gain setting value of the first reception signal before different frequency monitoring and a time taken for different frequency monitoring.

7. A device according to claim 1, wherein the preset algorithm comprises an algorithm for predicting an optimal value of a gain setting value for a first reception signal after different frequency monitoring by performing curve approximation of a history of variation in gain setting value of the first reception signal before different frequency monitoring.

8. A device according to claim 1, wherein a gain setting value used when automatic gain control is restarted is computed on the basis of a past change in gain setting value of said amplifier, and the computation result is used to restart automatic gain control.

9. A radio communication terminal having an automatic gain control device, characterized by comprising an automatic gain control device including:
    an amplifier for a reception signal, which can set a gain;
    information processing means for extracting control data from an output from said amplifier and performing information processing for the data;
    storage means for storing a gain setting value of said amplifier; and
    control means for controlling a gain of said amplifier in accordance with a preset control algorithm,
    wherein on the basis of a result obtained when said control means computes the gain setting value stored in said storage means in accordance with the preset algorithm, said automatic gain control device controls the gain of said amplifier in correspondence with switching operation of a frequency of a reception signal, which is accompanied by different frequency monitoring in a compressed mode of said information processing means,
    wherein the preset algorithm comprises an algorithm for predicting an optimal value of a gain setting value for a first reception signal after different frequency monitoring on the basis of an amount of change in gain setting value of the first reception signal before different frequency monitoring and an amount of change in gain setting value for a second reception signal during different frequency monitoring.

10. A control method for an automatic gain control device characterized by comprising:
    providing an amplifier for a reception signal, which can set a gain;
    providing information processing means for extracting control data from an output from the amplifier and performing information processing for the data;
    providing storage means for storing a gain setting value of the amplifier;

providing control means for controlling a gain of the amplifier in accordance with a preset control algorithm; and on the basis of a result obtained when said control means computes the gain setting value stored in said storage means in accordance with the preset algorithm, causing said control means to control the gain of said amplifier in correspondence with switching operation of a frequency of a reception signal which is accompanied by different frequency monitoring in a compressed mode of said information processing means, wherein the preset algorithm comprises an algorithm for predicting an optimal value of a gain setting value for a first reception signal after different frequency monitoring on the wherein the prediction is based on an amount of change in gain setting value of the normal reception signal before different frequency monitoring and an amount of change in gain setting value for the reception signal during different frequency monitoring.

11. A control program for an automatic gain control device, characterized by causing control means of an automatic gain control device including an amplifier for an reception signal, which can set a gain, information processing means for extracting control data from an output from the amplifier and perfoming information processing for the data, storage means for storing a gain setting value of the amplifier, and control means for controlling a gain of the amplifier in accordance with a preset control algorithm, to control the gain of the amplifier in correspondence with operation of switching a frequency of a reception signal, which is accompanied by different frequency monitoring in a compressed mode by the information processing means, on the basis of a result obtain when the control means computes the gain setting value stored in the storage means in accordance with the present algorithm, wherein the present algorithm comprises an algorithm for predicting an optimal value of a gain value for a first reception signal after different frequency monitoring on the basis of an amount of change in gain setting value of the first reception siganl before different frequency monitoring and an amount of change in gain setting value for a second reception signal during different frequency monitoring.

12. An automatic gain control method characterized by comprising:

providing an amplifier which can set a gain; and when a signal with a frequency different from that of a normal reception signal is to be monitored, predicting a gain setting value of the normal reception signal after the monitoring from a history of change in gain setting value of the normal reception signal before the monitoring, and performing gain control of the amplifier after the monitoring by using the predicting value.

13. A radio communication system characterized by comprising a radio communication terminal equipped with an automatic gain control device, a base station, and a base station controller, wherein said base station controller instructs said radio communication terminal through said base station to perform different frequency monitoring in a compressed mode, and said automatic gain control device includes an amplifier for a reception signal, which can set a gain, information processing means for extracting control data from an output from said amplifier and performing information processing for the data, storage means for storing a gain setting value of said amplifier, and control means for controlling a gain of said amplifier in accordance with a preset control algorithm, and on the basis of a result obtained when the control means computes the gain setting value stored in the storage means in accordance with the preset algorithm, the control means controls the gain of the amplifier in correspondence with operation of switching a frequency of a reception signal, which is accompanied by different frequency monitoring, wherein the preset algorithm comprises an algorithm for predicting an optimal value of a gain setting value for a first reception signal after different frequency monitoring on the basis of an amount of change in gain setting value of the first reception signal before different frequency monitoring and an amount of change in gain setting value for a second reception signal during different frequency monitoring.

14. A radio communication method characterized by comprising:

using a radio receiver which monitors a signal from a second radio communication system using a frequency band different from that of a first radio communication system during communication with the first radio communication system used in a compressed mode;

storing a first gain setting value during communication with the first radio communication system and a second gain setting value during monitoring of the second radio communication system;

using the first gain setting value for the first radio communication system which is stored before switching when the radio receiver is switched from the second radio communication system to the first radio communication system; and using the second gain setting value for the second radio communication system which is stored before switching when the radio receiver is switched from the first radio communication system to the second radio communication system, wherein an optimal value of a gain setting value for a first reception signal after different frequency monitoring is predicted on the basis of an amount of change in gain setting value of the first reception signal during communication with the first radio communication system and an amount of change in gain setting value for a second reception signal during communication with the second radio communication system.

* * * * *

UNITED STATES PATENT AND TRADEMARK OFFICE
CERTIFICATE OF CORRECTION

PATENT NO. : 7,392,027 B2
APPLICATION NO. : 11/087574
DATED : June 24, 2008
INVENTOR(S) : Takeshi Ishihara Page 1 of 1

It is certified that error appears in the above-identified patent and that said Letters Patent is hereby corrected as shown below:

In the Claims:

Claim 10, column 17, line 14, after "the", please insert --basis of an amount of change in gain setting value of the first reception signal before different frequency monitoring and an amount of change in gain setting value for a second reception signal during different frequency monitoring.--.

Claim 10, column 17, lines 15-19, please delete in their entirety.

Signed and Sealed this

Second Day of December, 2008

JON W. DUDAS
*Director of the United States Patent and Trademark Office*